United States Patent [19]
Shin

[11] Patent Number: 6,043,709
[45] Date of Patent: Mar. 28, 2000

[54] TRANSCONDUCTOR FOR PROCESSING A VERY HIGH FREQUENCY SIGNAL

[75] Inventor: Yun Tae Shin, Kyoungki-do, DPR of Korea

[73] Assignee: Hyundai Electronics Industries Co., Ltd., Kyoungki-do, Rep. of Korea

[21] Appl. No.: 09/106,203

[22] Filed: Jun. 29, 1998

[30] Foreign Application Priority Data

Jun. 30, 1997 [KP] DPR of Korea ............... 97-29640

[51] Int. Cl.[7] .................................................. H03F 3/45
[52] U.S. Cl. ........................................ 330/253; 330/261
[58] Field of Search ................................ 330/261, 253, 330/259, 257, 290

[56] References Cited

U.S. PATENT DOCUMENTS

| | | | |
|---|---|---|---|
| 4,481,478 | 11/1984 | Flink et al. | 330/253 |
| 4,807,188 | 2/1989 | Casagrande | 365/182 |
| 5,406,222 | 4/1995 | Brokaw | 330/257 |
| 5,457,426 | 10/1995 | Brehmer | 330/253 |
| 5,635,879 | 6/1997 | Sutardja et al. | . |
| 5,789,980 | 8/1998 | Nagata et al. | 330/253 |

*Primary Examiner*—Benny Lee
*Assistant Examiner*—Henry Choe
*Attorney, Agent, or Firm*—Jacobson, Price, Holman & Stern, PLLC

[57] ABSTRACT

The present invention provides a transconductor for allowing a user to adjust the transconductance of the transconductor having wide linear input range and large output resistance and the transconductor for processing high frequency signals includes an input portion for receiving at least one input signal and generating a primary current in response to the input signal; a programmable bias unit for providing a bias current to the input portion; a current mirror unit for generaing a secondary current by mirroring the primary current; and at least one output terminal for providing one or more of output signals in response to the secondary current.

10 Claims, 8 Drawing Sheets

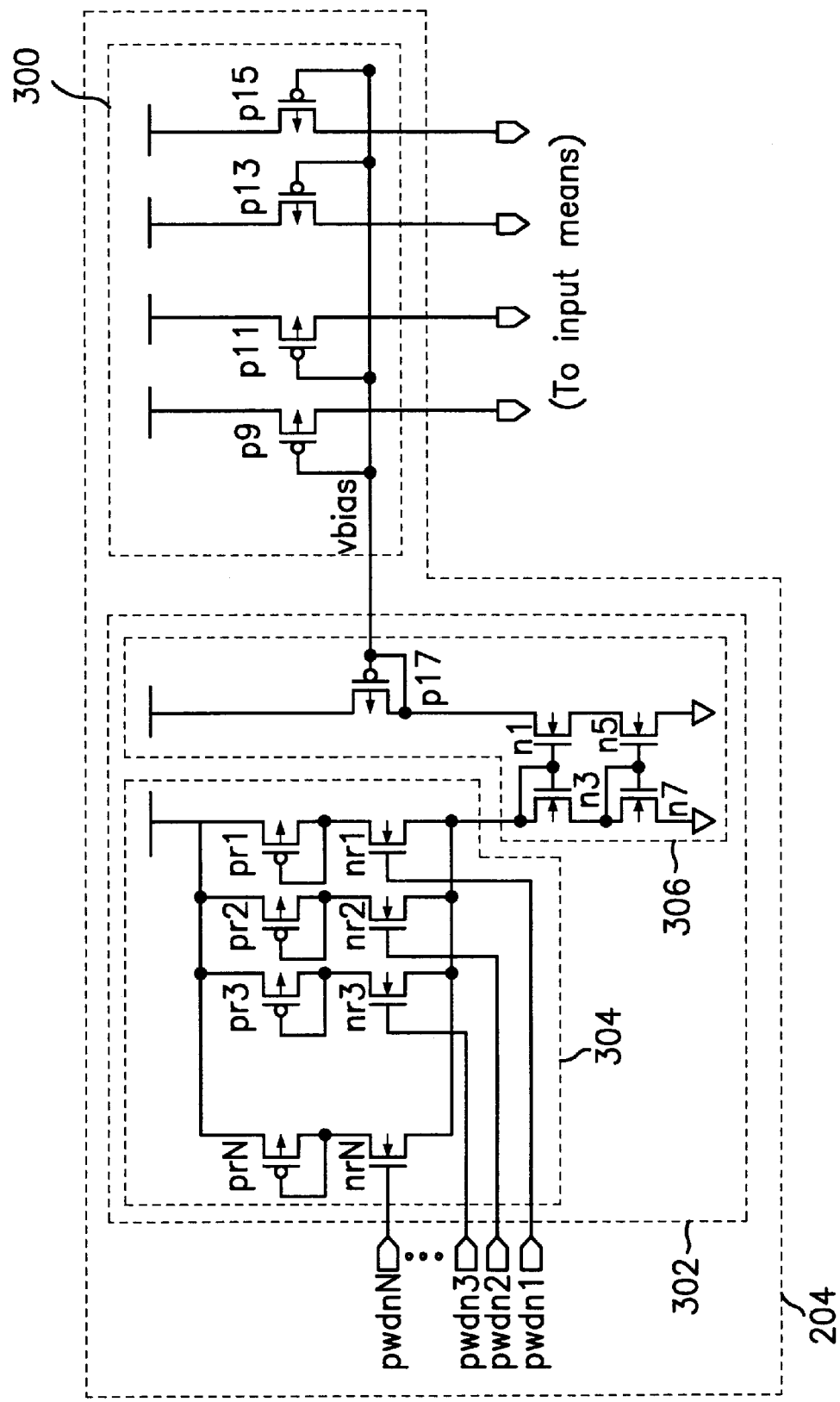

TRANSCONDUCTOR FOR PROCESSING A VERY HIGH FREQUENCY SIGNAL

FIELD OF THE INVENTION

The present invention relates to a transconductor for processing analog signals in the range of very high frequency ("VHF").

BACKGROUND OF THE INVENTION

Generally, a conventional transconductor for processing audio signals uses Switched-Capacitor of the characteristics of voltage controlled voltage source ("VCVS") to acquire high precision performance. However, in order to process mobile communication signals or VHF image signals, an operational amplifier having a wide bandwidth is needed so that the area of the integrated circuit is increased for this large operational amplifier.

As one of the conventional solutions to the above mentioned problem, a transconductance which uses a voltage controlled current source ("VCCS") is suggested. FIG. 1 shows a circuit diagram of the conventional VCCS transconductor.

However, the overall dynamic range of the conventional transconductor is narrow because the operating point of input terminals of the transconductor is unstable. Further, since the output resistance of the transconductor is small, when this transconductor is used in, for example, a filter, the characteristics of the filter is degraded. Still further, the transconductance of the conventional transconductor can not be adjusted by users.

SUMMARY OF THE INVENTION

Therefore, the present invention has been made in view of the above mentioned problem, and the present invention provides a transconductor for allowing a user to adjust the transconductance of the transconductor having wide linear input range and large output resistance.

In accordance with an aspect of the present invention, there is disclosed a transconductor for processing high frequency signals includes an input portion for receiving at least one input signal and generating a primary current in response to the input signal; a programmable bias unit for providing a bias current to the input portion; a current mirror unit for generating a secondary current by mirroring the primary current; and at least one output terminal for providing one or more of output signals in response to the secondary current.

BRIEF DESCRIPTION OF THE DRAWINGS

A further understanding of the nature and advantage of the present invention will become apparent by reference to the remaining portions of the specification and drawings, in which:

FIGS. 3a to 3d are circuit diagrams of a transconductor according to an embodiment of the present invention;

DETAILED DESCRIPTION OF THE PREFERRED EMBODIMENT

A detailed description of an embodiment according to the present invention will be given below with reference to the attached drawings.

Figure 1:
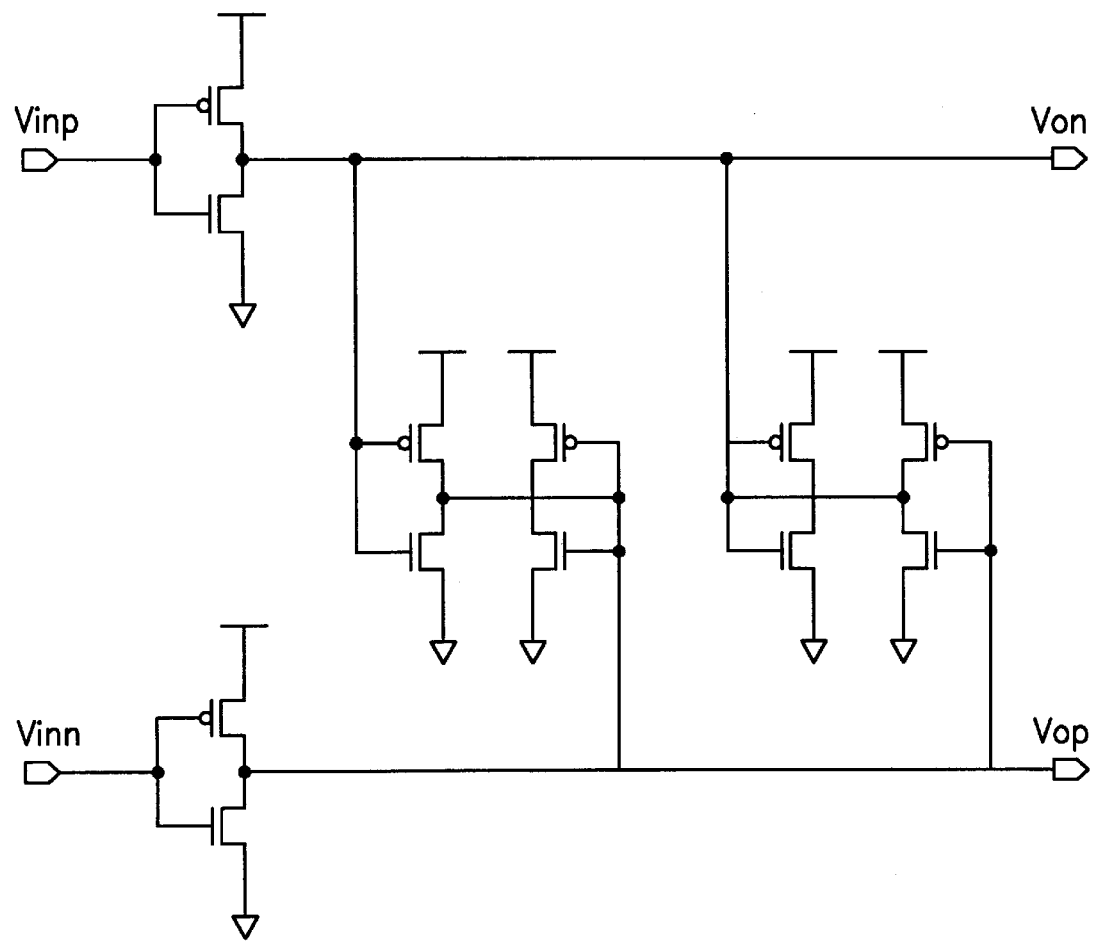
FIG. 1 is a circuit diagram of a conventional transconductor.
Figure 2:
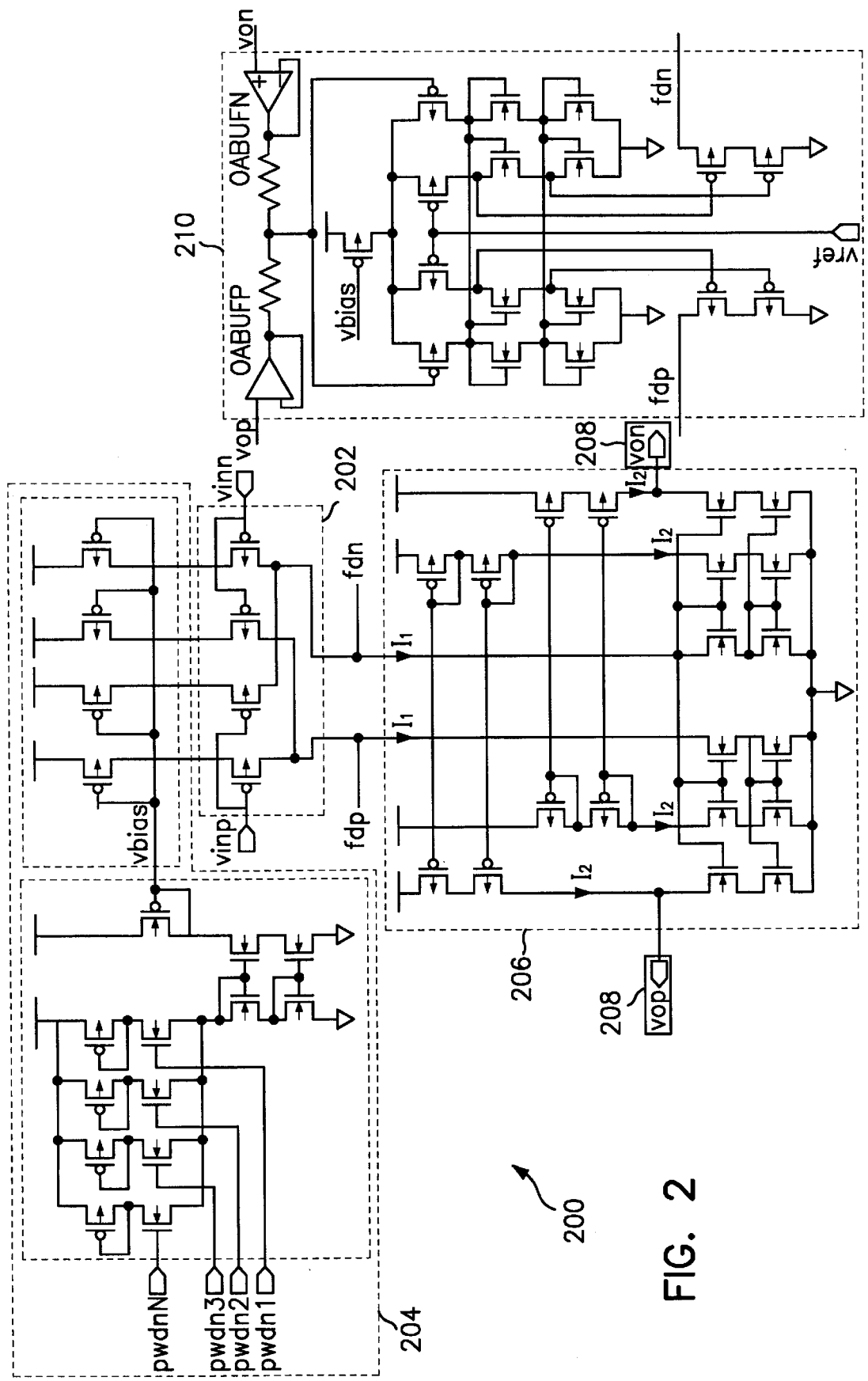
FIG. 2 is a schematic circuit diagram of a transconductor according to the present invention.

Now, referring to FIG. 2, FIG. 2 is a schematic circuit diagram of a transconductor according to the present invention. As shown in FIG. 2, the transconductor 200 includes an input portion 202 for receiving input signals Vinp and Vinn, a programmable bias unit 204 for providing bias currents to the input portion 202 in order to implement a linear input characteristic, a current mirror unit 206 for mirroring currents from the input portion 202 in response to the input signals Vinp and Vinn, output terminals 208 for providing output signals Vop and Von in response to the currents generated by the current mirror unit 206 and a feedback unit 210 for feedbacking the output signals Vop and Von to the input portion in order to stabilize the operating point.

Now, with reference to FIGS. 3a to 3d, a preferred embodiment of the transconductor 200 is described in detail, hereinafter.

Figure 3A:
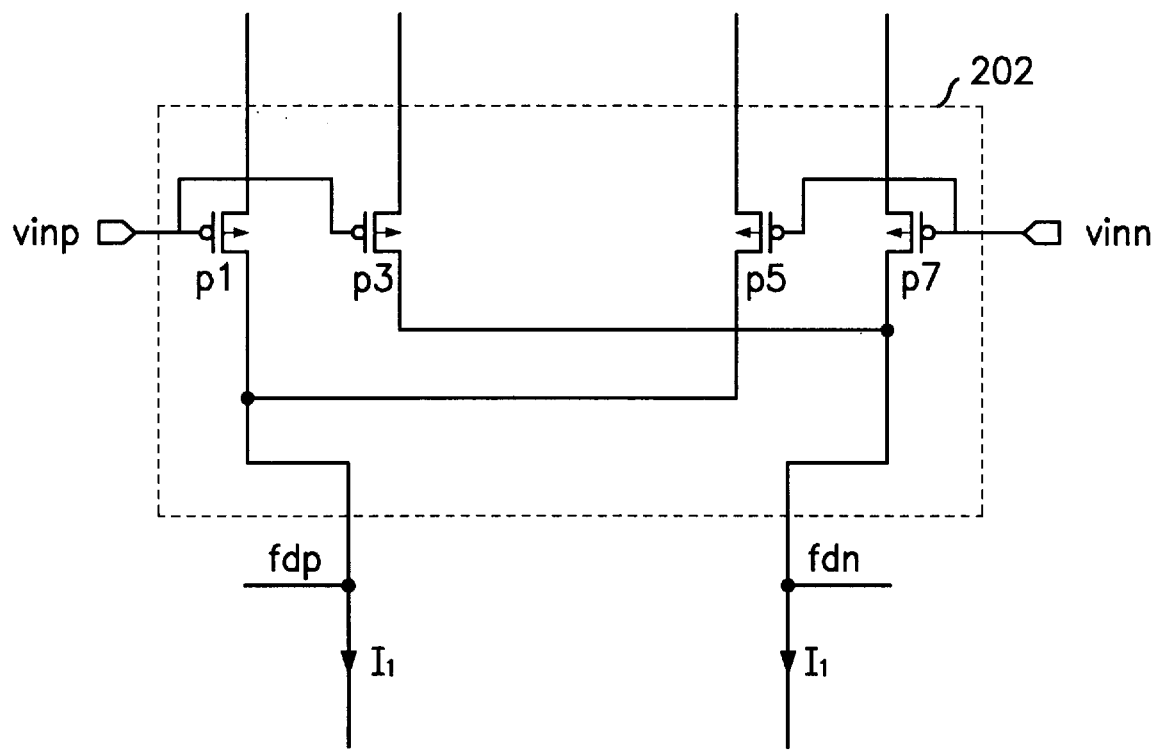

Referring to FIG. 3a, FIG. 3a is a detailed circuit diagram of the input portion 202. As shown in FIG. 3a, the input portion 202 includes two (2) PMOS transistors P1 and P3 for receiving an input signal Vinp at the gates of them and two (2) PMOS transistors P5 and P7 for receiving an inverted input signal Vinn at the gates of them. The drains of the PMOS transistor P1 and the PMOS transistor P5 are coupled together and the drains of the PMOS transistor P3 and the PMOS transistor P7 are coupled together. The sources of four (4) PMOS transistors P1, P3, P5 and P7 are coupled to the programmable bias unit 204 so that the bias currents generated by the programmable bias unit 204 are provided to them. Further, drains of the PMOS transistors P1, P3, P5 and P7 are coupled to the current mirror unit 206 so that a primary currents I1 is provided to the current mirror unit 206, wherein the primary current I1 is generated by the input portion 202 in response to the input signals Vinp and Vinn.

Referring to FIG. 3b, FIG. 3b is a detailed circuit diagram of the programmable bias unit 204. As shown in FIG. 3b, the programmable bias unit 204 includes a load device portion 300 and a programmable current controlling means 302. The load device portion 300 includes PMOS transistors P9, P11, P13 and P15 of which the sources are coupled to a power supply. The gates of the PMOS transistors P9, P11, P13 and P15 are controlled by a bias current control signal Vbias generated by the programmable current controlling means 302.

The programmable current controlling means 302 is used to allow a user to adjust the transconductance of the transconductor 200 (refer to FIG. 2) of the present invention. As shown in the drawing, the programmable current controlling means 302 includes a variable current generator 304 for generating a current of which the amount is variable in response to a program state defined by a plurality of programming signal pwdn1, pwdn2, pwdn3, . . . , pwdnN provided by the user. Further, the programmable current controlling means 302 also includes a current mirror 306 for generating bias current control signal Vbias by mirroring the current generated by the variable current generator 304.

The variable current generator 304 includes a plurality of NMOS transistors nr1, nr2, nr3, . . . , nrN for respectively receiving the plurality of programming signals pwdn1, pwdn2, pwdn3, . . . , pwdnN at the gates of the NMOS transistors nr1, nr2, nr3, . . . , nrN, wherein the sources of the NMOS transistors nr1, nr2, nr3, . . . , nrN are coupled together. Further, the variable current generator 304 also includes a plurality of PMOS transistors pr1, pr2, pr3, ..., prN respectively coupled between the NMOS transistors nr1, nr2, nr3, ..., nrN and the power supply, wherein the drains and the gates of the PMOS transistors pr1, pr2, pr3, ..., prN are coupled together.

The current mirror 306 of the programmable bias unit 204 is configured as e.g. a conventional Cascode current mirror circuit. The bias current control signal Vbias is generated by a PMOS transistor P17 coupled between the cascode current mirror circuit and the power supply, wherein the gate and the drain of the PMOS transistor P17 are coupled together.

Figure 3C:
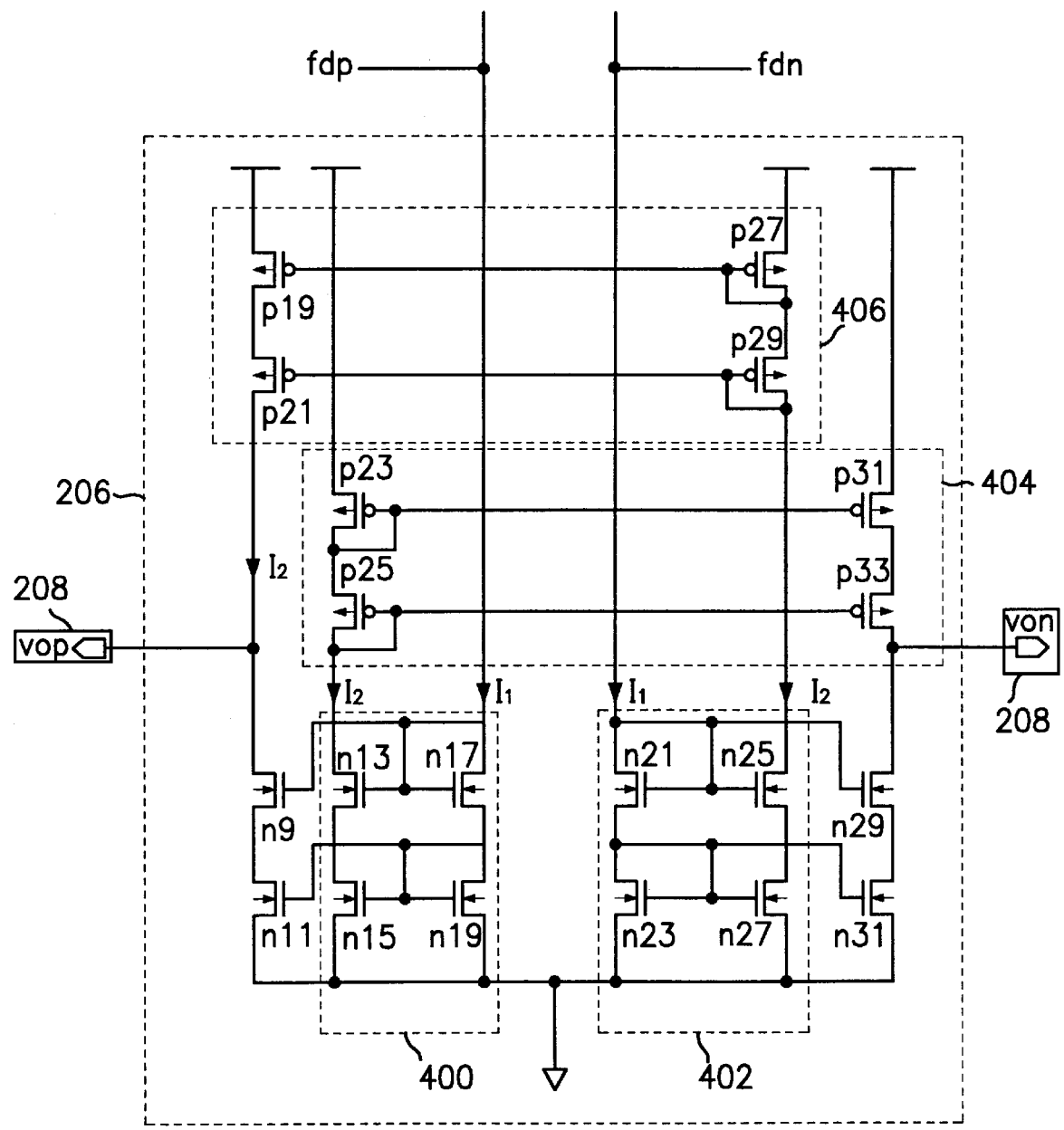

Referring to FIG. 3c, FIG. 3c is a detailed circuit diagram of the current mirror unit 206 includes a plurality of current mirrors 400, 402, 404 and 406 for converting the primary current I1 generated by the input portion 202 into output signals Vop and Von of the output terminals 208. As shown in FIG. 3c, the current mirror unit 206 includes a first current mirror 400 coupled to the drains of the PMOS transistors P1 and P5 of the input portion 202 for generating a secondary current I2 by mirroring the primary current I1, a second current mirror 402 also coupled to the drains of the PMOS transistors P3 and P7 of the input portion 202 for generating a secondary current I2 by mirroring the primary current I1, a third current mirror 404 for providing a current to the output terminal Von by mirroring the secondary current I2 generated by the first current mirror 400, and a fourth current mirror 406 for providing a current to the output terminal Vop by mirroring the secondary current I2 generated by the second current mirror 402. Further, the current mirror unit 206 also includes NMOS transistors N9 and N11 of which the gates are coupled to the first current mirror 400 and NMOS transistors N29 and N31 of which the gates are coupled to the second current mirror 402.

Figure 3D:
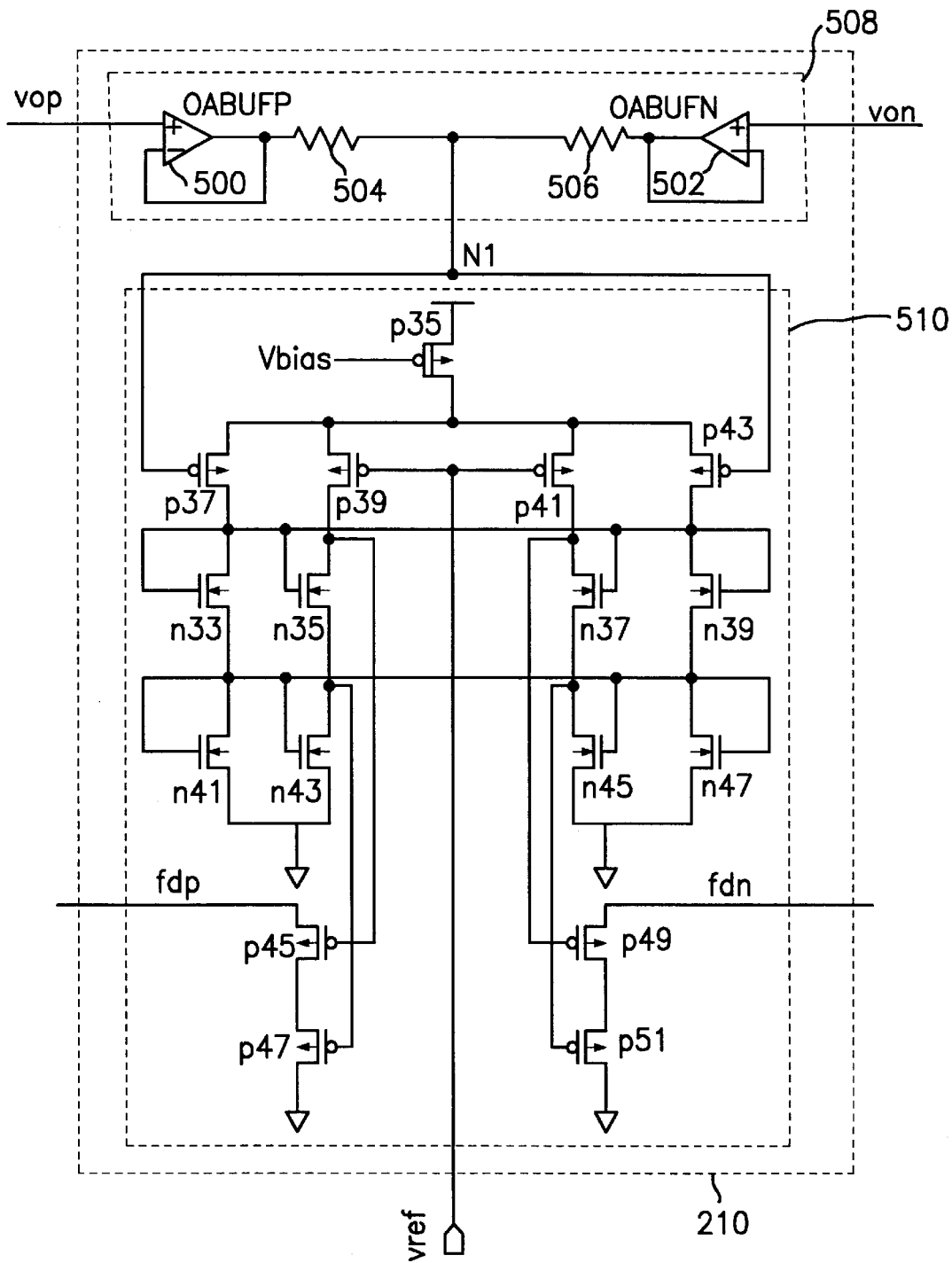

Now, referring to FIG. 3d, FIG. 3d is a detailed circuit diagram of the feedback unit 210. As shown in FIG. 3d, the feedback unit 210 includes a common voltage generator 508 for receiving the output signals Vop and Von of the output terminals 208 as input signals. The common voltage generator 508 includes a first buffer 500 for receiving the output signal Vop, a first resistor 504 coupled to the output terminal of the first buffer 500, a second buffer 502 for receiving the inverted output signal Von and a second resistor 506 coupled to the output terminal of the second buffer 502. The first and second resistors 504 and 506 are coupled together at node N1, so that a common voltage is generated at the node N1.

Further, the feedback unit 210 also includes a voltage comparator 510 for comparing the common voltage with a reference voltage Vref. As shown in FIG. 3d, the voltage comparator 510 includes a PMOS transistor P35 for receiving the bias current control signal Vbias at the gate of it, the source of the PMOS transistor P35 being coupled to the power supply, two (2) PMOS transistors P37 and P43 of which the gates are coupled to the common voltage node N1 and the sources are coupled to the drain of the PMOS transistor P35, and two (2) PMOS transistors P39 and P41 of which the gates are coupled to the reference voltage Vref and the sources are coupled to the drain of the PMOS transistor P35. Further, the voltage comparator 510 includes four (4) NMOS transistors N33, N35, N37 and N39 of which the drains are respectively coupled to the drains of the PMOS transistors P37, P39, P41 and P43 and the gates are coupled together, and four (4) NMOS transistors N41, N43, N45 and N47 of which the sources are respectively coupled to the drains of the NMOS transistors N33, N35, N37 and N39 and the gates are coupled together. Still further, the voltage comparator 510 includes two (2) PMOS transistors P47 and P51 of which the gates are respectively coupled to the drains of the NMOS transistors N43 and N45 and the drains are coupled to the ground and two (2) PMOS transistors P45 and P49 of which the gates are respectively coupled to the drains of the PMOS transistors N35 and N37 and the drains are respectively coupled to the sources of the PMOS transistors N35 and N37. The sources of the PMOS transistors P47 and P51 are respectively coupled to the drains of the PMOS transistors P1 and P5 and P3 and P7 in order to form a feedback loop to the input terminal 202 (refer to FIG. 3a).

Now, the operation of the transconductor 200 is described in detail.

The input terminal 202 of the transconductor 200 of the present invention receives complementary inputs Vinp and Vinn in order to implement linear input characteristic. The inputs Vinp and Vinn should meet the conditions defined as follows;

i) Vinn=−Vinp or ii) Vinp=V0+vi and Vinn=V0−vi (V0 is a constant)

When the inputs which meet one of the above conditions are provided to the input terminal 202, the currents generated by the programmable bias unit 204 are converted into the primary currents I1. Since the inputs are complementary, the primary current I1 is equal to the difference between the current corresponding to the input Vinp and the current corresponding to the input Vinn, such that both of the currents corresponding the inputs are generated by the PMOS transistors P1, P3, P5 and P7. Therefore, the primary current I1 has the characteristic where the nonlinear elements of the inputs Vinp and Vinn are removed.

Since the amount of bias currents provided to the input terminal 202 can vary as the programmed state of the programmable bias unit 204, the amount of the primary current I1 can also vary as the programmed state. Therefore, the user can change the transconductance of the transconductor 200 by changing the programmed state of the programmable bias unit 204.

Then, the secondary current I2 is generated by the current mirror unit 204 by mirroring the primary current I1 and provided to the output terminals 208 to generate the output signals Vop and Von. If the current generated by the programmable bias unit 204 is increased by the user, the operating point of the output signals Vop and Von rise. Since this rise of the operating point may result in the degradation of the characteristics of the transconductor 200, a reference voltage is needed to maintain the operating point in a proper level. This feature can be accomplished by the feedback unit 210. When the output voltage level is higher than the reference voltage level, the drain voltage of the NMOS transistors N35, N37, N43 and N45 of the feedback unit 210 rises. Therefore, the amount of the currents which flow through the PMOS transistors P45, P47, P49 and P51 is increased and the output voltage level becomes lower and lower so that the operating point is maintained in a proper level.

Figure 4:
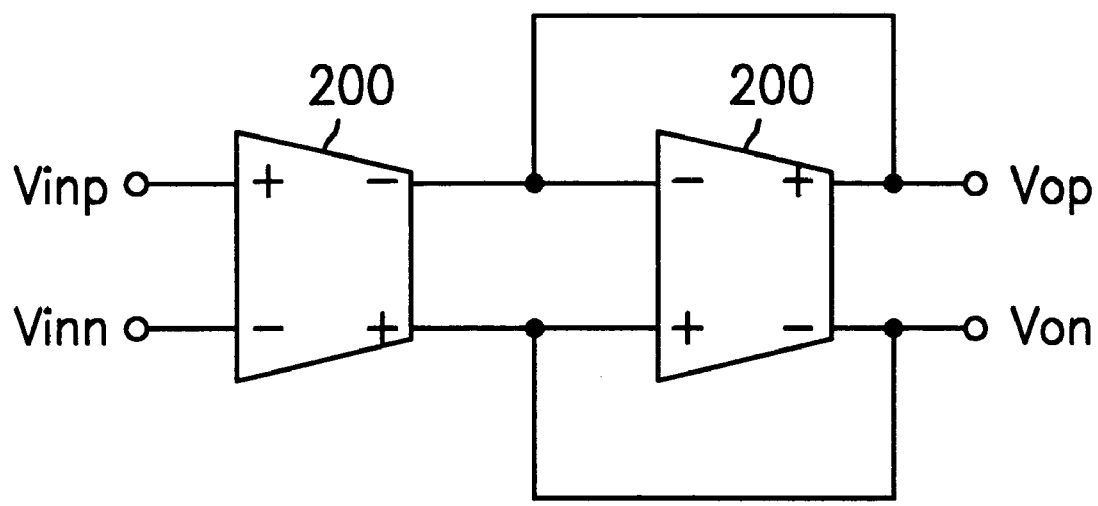
FIG. 4 is a schematic circuit diagram of a unit voltage gain amplifier to which the transconductor of the present invention is applied.
Figure 5:
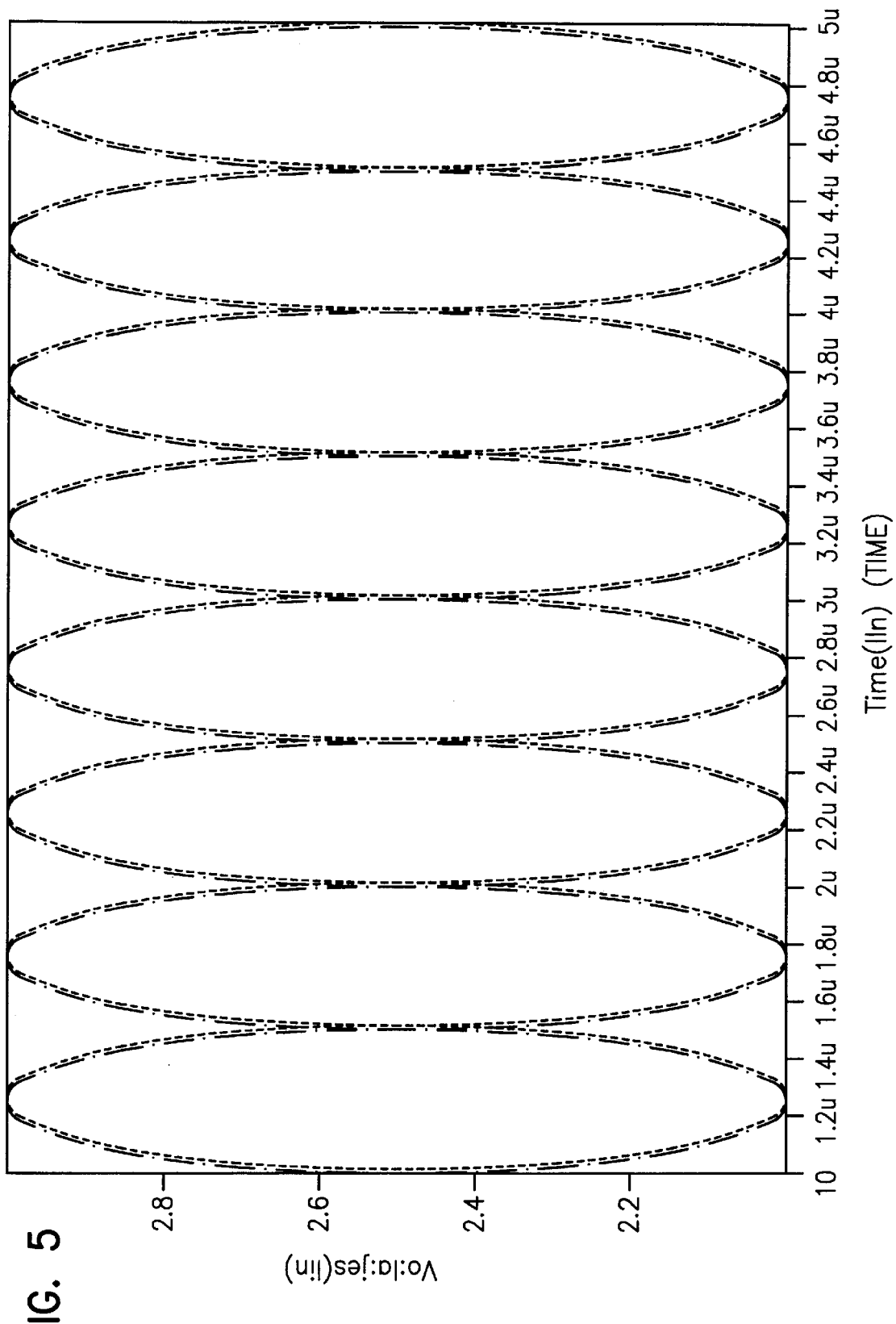
FIG. 5 is a graph which shows the operation characteristic of the unit voltage gain amplifier of FIG. 4.

Now, referring to FIGS. 4 and 5, FIG. 4 is a schematic circuit diagram of a unit voltage gain amplifier to which the transconductor of the present invention is applied, and FIG. 5 is a graph which shows the operation characteristic of the unit voltage gain amplifier of FIG. 4. In this example, the programmable bias unit 204 is programmed to generate a bias current of 80 µA, the power supply is 5V and a sine wave of 1 MHz is used as input signal.

As described above, according to the present invention, a transconductor for allowing a user to adjust the transconductance of the transconductor having wide linear input range and large output resistance is provided.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A transconductor for processing high frequency signals comprising:
    an input portion for receiving at least one input signal and generating a primary current in response to said input signal;
    a programmable bias unit for providing a variable bias current to said input portion;
    a current mirror unit for generating a secondary current by mirroring said primary current; and
    at least one output terminal for providing one or more of output signals in response to said secondary current,
    a feedback unit for stabilizing operating point of said output signal
    wherein a transconductance of the transconductor varies depending upon the variable bias current.

2. A transconductor as claimed in claim 1, wherein said input portion comprises,
    a first and a second transistors for receiving an input signal; and
    a third and a fourth transistors for receiving an inverted input signal,
    wherein, drains of said first and third transistors are coupled together and drains of said second and fourth transistors are coupled together.

3. A transconductor as claimed in claim 1, wherein said programmable bias unit comprises,
    a programmable current controlling means for generating a bias current control signal in response to a program state defined by a plurality of programming signals provided by a user, wherein the amount of said bias current is variable; and
    a load device portion of which the amount of load is controlled by said bias current control signal.

4. A transconductor as claimed in claim 3, wherein said programmable current controlling means comprises,
    a variable current generator for generating a current of which the amount is variable in response to said program state defined by said plurality of programming signals provided by said user; and
    a current mirror for generating said bias current control signal by mirroring said current generated by said variable current generator.

5. A transconductor as claimed in claim 4, wherein said variable current generator comprises,
    a plurality of NMOS transistors for respectively receiving said plurality of programming signals at the gates of said NMOS transistors, wherein sources of said NMOS transistors are coupled together; and
    a plurality of PMOS transistors respectively coupled between said NMOS transistors and said power supply, wherein drains and gates of said PMOS transistors are coupled together.

6. A transconductor as claimed in claim 3, wherein said load device portion comprises,
    a plurality of PMOS transistors of which sources are coupled to said power supply.

7. A transconductor as claimed in claim 1, wherein said current mirror unit comprises,
    a first current mirror coupled to said first and third transistors of said input portion for generating said secondary current by mirroring said primary current;
    a second current mirror coupled to said second and fourth transistors of said input portion for generating said secondary current by mirroring said primary current;
    a third current mirror for providing a current to said at least one output terminal by mirroring said secondary current generated by said first current mirror;
    a fourth current mirror for providing a current to said at least one output terminal by mirroring said secondary current generated by said second current mirror;
    a fifth transistor of which gate is coupled to said first current mirror; and
    a sixth transistor of which gate is coupled to said second current mirror.

8. A transconductor as claimed in claim 1, wherein said feedback unit comprises,
    a common voltage generator for receiving said output signals and generating a common voltage corresponding to said output signals; and
    a voltage comparator for comparing said common voltage with a reference voltage.

9. A transconductor as claimed in claim 8, wherein said common voltage generator comprises,
    a first buffer for receiving one of said output signals;
    a first resistor coupled to an output terminal of said first buffer;
    a second buffer for receiving an inverted signal of said one of said output signals; and
    a second resistor coupled to an output terminal of said second buffer.

10. A transconductor as claimed in claim 8, wherein said voltage comparator comprises,
    a first PMOS transistor for receiving said bias current control signal, source of said first PMOS transistor being coupled to said power supply,
    a second and third PMOS transistors of which gates are coupled to said common voltage node and sources are coupled to drain of said first PMOS transistor;
    a fourth and fifth PMOS transistors of which gates are coupled to said reference voltage and sources are coupled to drain of said first PMOS transistor;
    a first, second, third and fourth NMOS transistors of which drains are respectively coupled to drains of said first, second, third and fourth PMOS transistors and gates are coupled together, and
    a fifth, sixth, seventh and eighth NMOS transistors of which sources are respectively coupled to drains of said first, second, third and fourth NMOS transistors and gates are coupled together,
    a sixth and seventh PMOS transistors of which gates are respectively coupled to drains of said sixth and seventh NMOS transistors and drains are coupled to a ground voltage, and
    a eighth and ninth PMOS transistors of which gates are respectively coupled to drains of said fourth and fifth PMOS transistors and said drains are respectively coupled to sources of said sixth and seventh PMOS transistors,
    wherein sources of said eighth and ninth PMOS transistors are respectively coupled to drains of said first and second transistors of said input terminal in order to form a feedback loop to said input terminal.

* * * * *